(12) United States Patent
Kuisma

(10) Patent No.: US 9,541,464 B2
(45) Date of Patent: Jan. 10, 2017

(54) PRESSURE SENSOR STRUCTURE

(71) Applicant: MURATA MANUFACTURING CO., LTD., Nagaokakyo-shi, Kyoto (JP)

(72) Inventor: Heikki Kuisma, Helsinki (FI)

(73) Assignee: MURATA MANUFACTURING CO., LTD., Nagaokakyo-shi, Kyoto (JP)

( * ) Notice: Subject to any disclaimer, the term of this patent is extended or adjusted under 35 U.S.C. 154(b) by 176 days.

(21) Appl. No.: 14/293,317

(22) Filed: Jun. 2, 2014

(65) Prior Publication Data

US 2014/0352446 A1    Dec. 4, 2014

(30) Foreign Application Priority Data

Jun. 4, 2013 (FI) .................................... 20135618

(51) Int. Cl.
| | |
|---|---|
| *G01L 9/12* | (2006.01) |
| *B81B 3/00* | (2006.01) |
| *G01L 19/06* | (2006.01) |
| *G01L 9/00* | (2006.01) |
| *G01L 13/00* | (2006.01) |

(52) U.S. Cl.
CPC ............... *G01L 9/12* (2013.01); *B81B 3/0086* (2013.01); *G01L 9/0072* (2013.01); *G01L 19/0654* (2013.01); *B81B 2201/0264* (2013.01); *G01L 13/00* (2013.01)

(58) Field of Classification Search
None
See application file for complete search history.

(56) References Cited

U.S. PATENT DOCUMENTS 4,935,841 A * 6/1990 Jonsson ................ G01L 9/0075
                                                 361/283.4
6,295,875 B1 * 10/2001 Frick ...................... G01L 9/0072
                                                 73/718

(Continued)

FOREIGN PATENT DOCUMENTS

| CN | 1083104 C | 4/2002 |
|---|---|---|
| CN | 1751232 A | 3/2006 |

(Continued)

OTHER PUBLICATIONS

Willem CHR. Heerens, "Application of Capacitance Techniques in Sensor Design", J. Phys. E: Sci, Instrum 19 (1986), The Institute of Physics, pp. 897-906.

(Continued)

*Primary Examiner* — Andre Allen
(74) *Attorney, Agent, or Firm* — Squire Patton Boggs (US) LLP

(57) ABSTRACT

A microelectromechanical pressure sensor structure that comprises a planar base and side walls and a diaphragm plate. The side walls extend circumferentially away from the planar base to a top surface of the side walls. The planar base, the side walls and the diaphragm plate are attached to each other to form a hermetically closed gap in a reference pressure, and a top edge of the inner surfaces of the side walls forms a periphery of a diaphragm. The diaphragm plate comprises one or more planar material layers of which a first planar material layer spans over the periphery of the diaphragm. The top surface of the side walls comprises at least one isolation area that is not covered by the first planar material layer.

29 Claims, 14 Drawing Sheets

(56) References Cited

U.S. PATENT DOCUMENTS

| | | | |
|---|---|---|---|
| 6,460,234 B1* | 10/2002 | Gianchandani | G01L 1/148 29/25.35 |
| 6,564,643 B1 | 5/2003 | Horie et al. | |
| 6,877,383 B2* | 4/2005 | Horie | G01L 9/0073 73/754 |
| 7,296,476 B2* | 11/2007 | Fortin | G01L 9/0073 73/756 |
| 7,305,889 B2* | 12/2007 | Fortin | G01L 9/0073 73/756 |
| 2004/0093954 A1* | 5/2004 | Gottlieb | G01L 19/147 73/754 |
| 2006/0179951 A1 | 8/2006 | Birkelund et al. | |
| 2006/0283255 A1 | 12/2006 | Tilak et al. | |
| 2009/0116675 A1* | 5/2009 | Miyoshi | B81B 3/0072 381/369 |
| 2012/0043627 A1 | 2/2012 | Lin et al. | |
| 2012/0256237 A1* | 10/2012 | Lakamraju | B81C 1/00246 257/254 |
| 2013/0152694 A1 | 6/2013 | Urvas et al. | |
| 2015/0014797 A1* | 1/2015 | Schelling | B81B 3/0059 257/416 |
| 2015/0204744 A1* | 7/2015 | Kuisma | G01L 9/0072 73/718 |
| 2015/0226624 A1* | 8/2015 | Kuisma | G01L 9/0042 73/724 |

FOREIGN PATENT DOCUMENTS

| | | |
|---|---|---|
| EP | 0 657 718 A1 | 6/1995 |
| EP | 2492240 A1 | 8/2012 |
| JP | 2010-187303 A | 8/2010 |
| WO | WO 2013/003789 A1 | 1/2013 |

OTHER PUBLICATIONS

Wen H. Ko et al., "Touch Mode Capacitive Pressure Sensors", Sensors and Actuators 75 (1999) pp. 242-251.
International Search Report international application No. PCT/IB2014/061939 mailing date Sep. 15, 2014.
Finnish Search Report dated Mar. 24, 2014 corresponding to Finnish Patent Application No. 20135618.
Search Report dated Sep. 18, 2016 corresponding to Chinese Patent Application No. 201480031498.6.

* cited by examiner

PRESSURE SENSOR STRUCTURE

BACKGROUND

Field

The present invention relates to microelectromechanical devices and especially to an improved pressure sensor structure and a pressure sensor according to preambles of the independent claims.

Description of Related Art

Pressure is a physical quantity that corresponds to the ratio of force acting on a surface to the area of the surface. A device that can be used as a gauge to measure the pressure is a pressure sensor.

Micro-Electro-Mechanical Systems, or MEMS can be defined as miniaturized mechanical and electro-mechanical systems where at least some elements have some sort of mechanical functionality. Since MEMS devices may be created with the same tools used to create integrated circuits, micromachines and microelectronic elements can be fabricated on a piece of silicon to enable various types of devices.

FIG. 1 illustrates an exemplary structure of a microelectromechanical device for sensing of pressure. Microelectromechanical pressure sensors may comprise a thin diaphragm 10 that is spanned over a gap 12 that provides a reference pressure. The diaphragm deforms due to difference between the reference pressure and an ambient pressure surrounding the sensor. The diaphragm displacement may be translated to an electrical signal with capacitive or piezoresistive sensing.

A MEMS pressure sensor structure is typically formed of patterned layers of material. A MEMS fabrication process may involve combinations of layer depositions, optical lithography, etches and wafer bonding. FIG. 1 shows a side view and a top view of an exemplary structure of a microelectromechanical pressure sensor. The illustrated pressure sensor is an absolute pressure sensor that comprises a body structure formed by a planar base 11 and a side wall layer 13. The side walls formed by the side wall layer 13 extend away from the planar base 11 to form a hollow, the depth of which corresponds with the thickness of the side wall layer 13. In a category of pressure sensor structures, this hollow is hermetically sealed by a diaphragm plate 16 that extends on the side wall layer 13. A part of the diaphragm plate 16 that extends over the circumferential opening of the gap provides a diaphragm 10 whose periphery is defined by the opening. The diaphragm 10 is exposed on one side to the reference pressure of the gap and on the other side to the ambient pressure. This diaphragm 10 thus deforms in response to a pressure difference between the reference pressure and the ambient pressure. The extent of this deformation may be detected, for example, capacitively by arranging electrodes to elements on either sides of the gap and translating with the electrodes the deformation-induced change in the height of the gap into an electric signal.

The material layers of the MEMS sensor structure provide hermetic sealing of the gap so that practically no foreign substances can penetrate the gap after the hollow has been sealed by the diaphragm plate. However, the outer surfaces of the sensor structure are often exposed to ambient conditions that may cause resistive or capacitive leakage and other stray effects to the capacitive measurement results.

SUMMARY

The object of the present invention is to provide a pressure sensor structure that is increasingly robust against variations in ambient conditions, especially to variations in humidity.

The objective of the present invention is achieved with a pressure sensor structure and a pressure sensor according to the characterizing portions of the independent claims.

The preferred embodiments of the invention are disclosed in the dependent claims.

The claimed invention defines a microelectromechanical pressure sensor structure that comprises a planar base and a side wall layer and a diaphragm plate. The side walls of the side wall layer extend circumferentially away from the planar base to an opposite surface of the side wall layer. The planar base, the side wall layer and the diaphragm plate are attached to each other to form a hermetically closed gap in a reference pressure. A top edge of the inner surfaces of the side walls within the side wall layer forms a periphery of a diaphragm. The diaphragm plate comprises one or more planar material layers of which a first planar material layer spans over the periphery of the diaphragm. The top surface of the side wall layer comprises at least one isolation area that is not covered by the diaphragm plate.

The isolation area on the top surface of the side wall layer may be applied passively to improve insulation between an electrode element of the diaphragm and of the planar base. On the other hand, the isolation area may be applied actively with a conducting guard element and an operational amplifier circuit to eliminate or at least alleviate the stray effects caused by ambient humidity to the capacitive measurement results.

Features and advantages of the claimed invention and its embodiments are described in more detail with the detailed description of the embodiments.

BRIEF DESCRIPTION OF THE DRAWINGS

In the following the invention will be described in greater detail, in connection with preferred embodiments, with reference to the attached drawings, in which.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture in which various embodiments of the invention may be implemented. Only elements relevant for illustrating the embodiments are described in detail. Various implementations of pressure sensors comprise elements that are generally known to a person skilled in the art and may not be specifically described herein.

Figure 1:
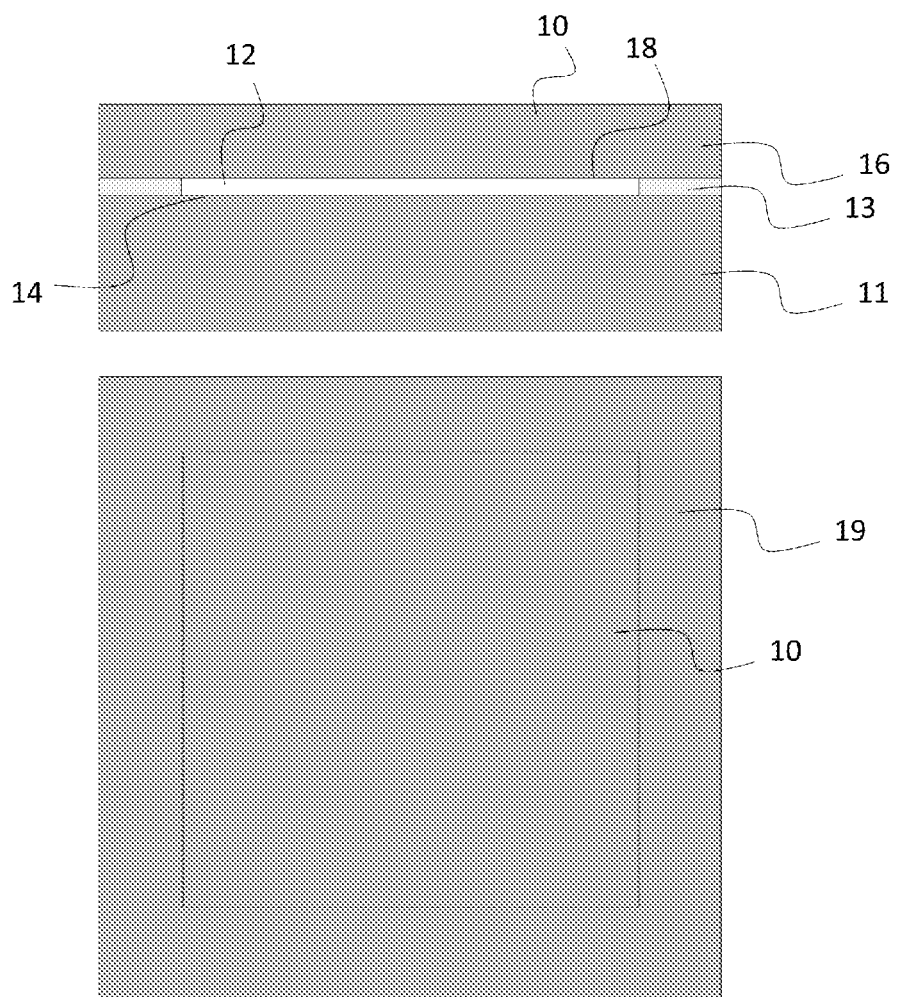
FIG. 1 shows a side view and a top view of an exemplary structure of a microelectromechanical pressure sensor.

Embodiments of the pressure sensor structure apply elements that are discussed in more detail with reference to FIG. 1. FIG. 1 illustrates the exemplary structure of a microelectromechanical pressure sensor, and shows a side view and a top view of the illustrated sensor structure. The illustrated pressure sensor structure comprises a body structure formed by a planar base 11 and a side wall layer 13. The planar base 11 may be manufactured from a wafer of silicon material, but other conductor, semiconductor or insulator materials may be applied within the scope of protection. The planar base 11 may also consist of layers of material. As an example, a layer on the surface of the planar base may be electrically conductive to act as an electrode of a capacitive sensor. As another example, the entire planar base may have high enough conductivity to act as an electrode. The planar base 11 has a first surface 14 that extends essentially along a plane of the planar base 11. The term essentially means here that the first surface may accommodate minor surface structures (bumps or cavities), but over 90% of the surface area is, within tolerances, aligned to the plane of the planar base 11.

The side wall layer 13 is a non-continuous layer that provides side walls that extend away from the first surface 14, advantageously to a direction that is perpendicular to the first surface 14, as shown in FIG. 1. A surface of the side wall layer furthermost from the first surface 14 is a top surface of the side wall layer. A surface or surfaces of the side wall layer opposite the gap is an outer surface of the side wall layer. The side wall layer 13 is rigidly attached to the planar base 11 and thus circumscribes an open space onto it. Together with the planar base 11, the side walls of the side wall layer 13 form a hollow, the depth of which corresponds with the height of the side walls, and the thickness of the side wall layer 13. Typically the side wall layer is very thin, and thus the hollow is very low, in the order of micrometers. The side wall layer may be of electrically insulating material, like silicon dioxide, but other electrically insulating materials may be applied within the scope of protection. In the top view of the example structure, the top surface 19 of the side wall layer 13 is illustrated with a rectangular perimeter such that the side wall extends outwards from the dotted line. The dotted line denotes the inner surfaces of the side walls, and top edge of these inner surfaces defines a circumferential opening of the hollow formed by the planar base 11 and the side wall layer 13.

This hollow is hermetically sealed by the diaphragm plate 16 that extends on the side wall layer 13. The term diaphragm refers here to a film of elastically deforming material that is anchored at its periphery. The diaphragm plate 16 is a planar object that provides to the sensor structure a diaphragm 10 and anchors the diaphragm at its periphery. The diaphragm plate 16 may be made of one or more material layers. Silicon material is often used at least in one layer of the diaphragm plate, but other conductor, semiconductor or insulator materials may be applied within the scope of protection. The diaphragm plate 16 connects to the side wall layer 13 through a second surface 18 that is a plane initially parallel to the first surface 14 of the planar base 11. It is noted that the term initially relates here to the dimensions of the elements in the manufacturing stages of the sensor. A person skilled in the art understands that during operation of the pressure sensor parts may deform out of their initial planar form.

The planar base 11, the side wall layer 13 and the diaphragm plate 16 are attached to each other such that the first surface 14, the second surface 18 and the inner surfaces of the side walls 13 form a hermetically closed gap 12 in a reference pressure. The gap 12 may be evacuated to contain only small amounts of residual gases, but it can also be filled with a selected gas or other volatile material at a selected reference pressure.

A part of the diaphragm plate 16 that extends over the circumferential opening to the gap 12 provides the diaphragm 10 whose periphery is defined by the opening. The deformation of the diaphragm 10 may be detected capacitively or alternatively with a piezoresistive or similar straingauge based method by translating deformation-induced stress in the diaphragm into an electrical signal with incorporated piezoresistors or strain-gauge resistors. All of these methods are disclosed in the art and as such well known to a person skilled in the art will not be discussed in more detail in this text.

Figure 2:
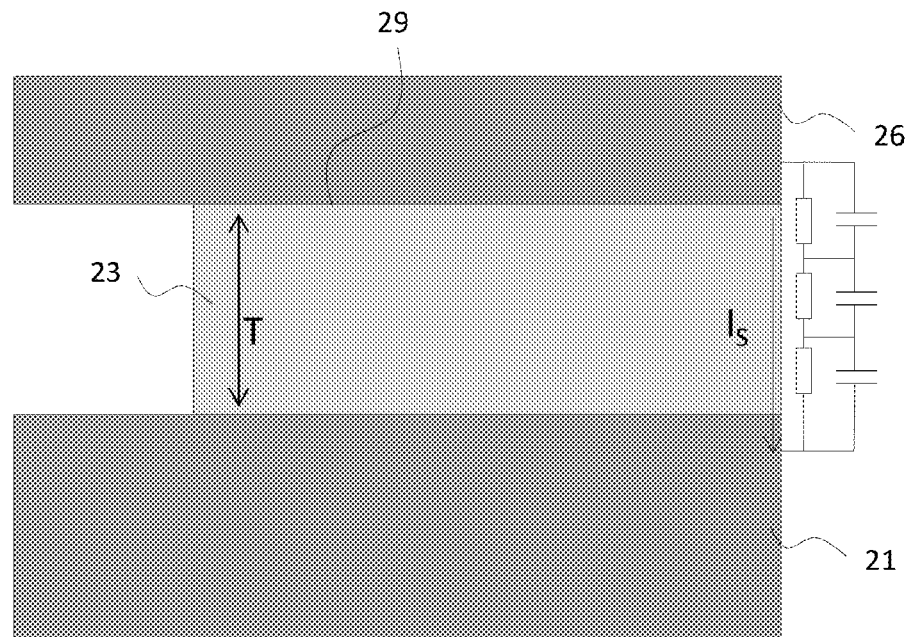
FIG. 2 illustrates an embodiment of a microelectromechanical pressure sensor structure.

FIG. 2 illustrates a cross section of outer surfaces of the prior art pressure sensor structure of FIG. 1. As discussed earlier, typically the planar base and the diaphragm plate are layers of conductive or dielectric materials and the side walls are provided by a layer of insulating material. The side wall layer may be quite thin, even in the order of one or more micrometers. This means that the insulating distance from the diaphragm plate to the planar base is equally short. In humid conditions, the surface conductivity, and thus the resistive and capacitive leakage current of the insulator will rise, and this may cause remarkable erroneous increase to capacitances measured over the gap. In embodiments of the invention, the detrimental leakages are eliminated or at least alleviated by means of one or more isolation areas, arranged to the top surface of the side wall layer. As discussed above, the diaphragm plate may comprise one or more planar material layers, and one of them is a first planar material layer that spans over the periphery of the diaphragm. An isolation area refers here to a region of the top surface of the side wall layer that is not covered by the one or more material layers of the diaphragm plate.

FIG. 2 is a side view that shows the sensor structure from its width direction, and shows the planar base 21, the side wall layer 23 and the diaphragm plate 26 elements described in more detail above with FIG. 1. The top surface 29 of the side wall layer is a circumferential surface that at least partly coincides with the second surface. An insulating distance T is provided by the thickness of the side wall layer 23, and $I_s$ illustrates the resistive and capacitive leakage current on the outer surface over the distance T.

Figure 3:
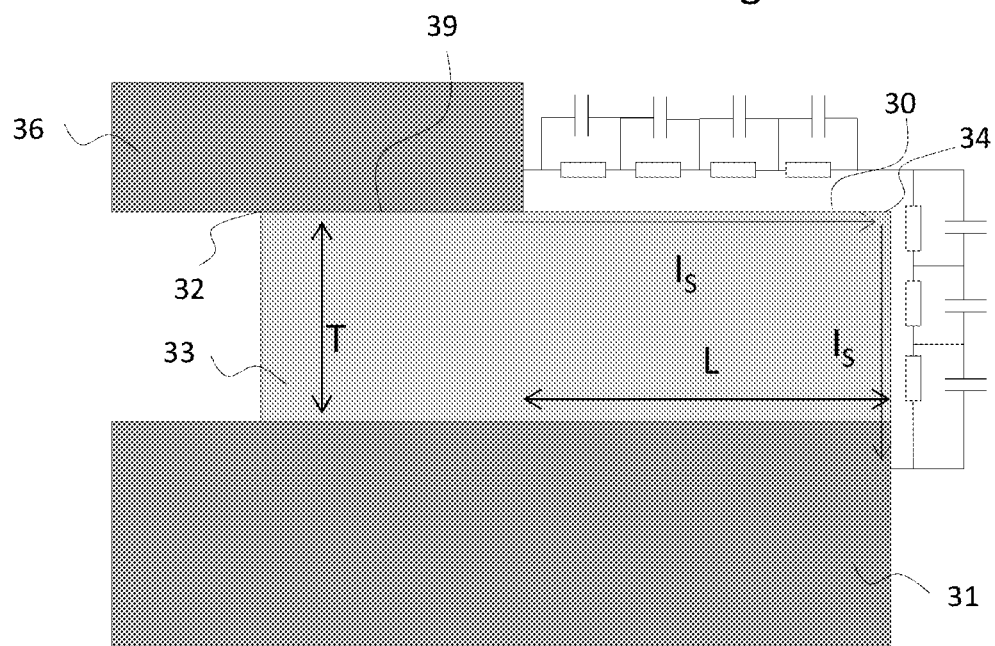
FIG. 3 illustrates an embodiment where the structure comprises an isolation area in regions near the periphery of the side wall layer.

FIG. 3 illustrates an embodiment of the invention where the prior art structure of FIG. 2 comprises an isolation area 30. As discussed earlier, the top edge 32 of the inner surface or surfaces of the side walls forms the periphery of the diaphragm. The isolation area 30, on the other hand, extends from the outer surface of the side wall layer 33 to a non-zero distance L towards the gap on the top surface of the side wall layer. As illustrated in FIG. 3, the increased distance from the diaphragm plate to the planar base along the surface of the insulating layer includes now the distance L provided by the isolation area and the thickness T of the layer that forms the side walls. The distance L is herein referred to as an isolation distance, and it represents here an extent of the isolation area along the top surface of the side wall layer.

It has been detected that by means of this increased distance, a significant reduction in the resistive and capacitive leakage current $I_s$ can be achieved. For example, finite element method (FEM) simulations have been made with an exemplary 0.535 mm wide sensor structure, 5 μm thick diaphragm plate, and 1 μm thick insulator of the side wall layer. The results show that the resistive and capacitive leakage current $I_s$ can be reduced by a factor of ten or more when isolation distances are of the order of tens of micrometers. The desired improvement is thus achieved with a simple structural feature that does not essentially pose new requirements to the sizing of the overall sensor structure or increase its cost.

Figure 4:
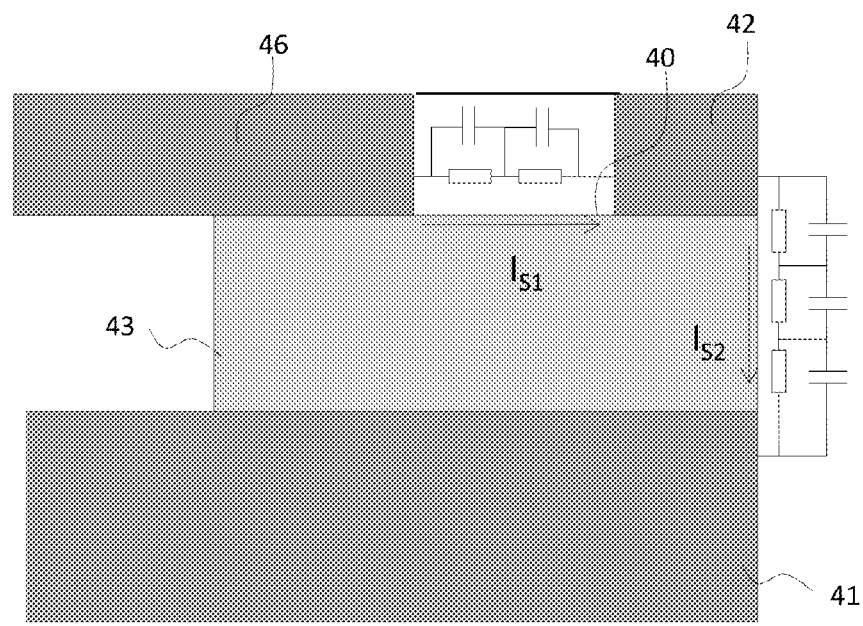
FIG. 4 illustrates an embodiment with an isolation area and a circumferential guard element that at least partly surrounds the diaphragm plate.

FIG. 4 illustrates another embodiment of the invention where effects of surface conductivity is further reduced by means of the isolation area and a circumferential guard element that at least partly surrounds the diaphragm plate. FIG. 4 is a side view that shows the sensor structure from its width direction, and shows the planar base 41, the side wall layer 43 and the diaphragm plate 46 elements described in more detail above with FIG. 1. It is understood that for the hermetic sealing of the gap, part of the top surface of the side wall layer is always covered by the first planar material layer of the diaphragm plate 46. In the embodiment of FIG. 4, the regions beyond the diaphragm plate on the top surface of the side wall layer are covered by the isolation area 40 and a guard element 42. The isolation area 40 begins from the diaphragm plate 46 and extends to a non-zero distance towards the outer surface of the side wall layer 43 therefrom. The guard element 42 is advantageously circumferential and circumscribes the diaphragm plate 46 and the isolation area 40. The guard element may extend from the outer surface of the side wall layer 43 to a non-zero distance towards the gap on the top surface of the side wall layer. It is, however, also possible to include a further isolation area to circumscribe the diaphragm plate 46, the isolation area 40 and the guard element 42.

As in the embodiment of FIG. 3, the isolation area 40 increases the insulating distance to be crossed by the stray currents during operation. In addition, it has been noticed that the remaining effect from the leakage currents can be eliminated or at least significantly alleviated by means of a capacitive converter circuit with a closed loop operational amplifier. The measured capacitance results from the capacitance between the planar base 41 and the diaphragm plate 46 and between the planar base 41 and the guard element 42. In the sensor structure of FIG. 4, if the operational amplifier circuit is arranged to keep the guard element 42 in the same potential as the electrode of the either of the diaphragm plate 46 or the planar base 41, the voltage output of the operational amplifier can be made to be essentially indicative of the capacitance between the diaphragm plate and the planar base only. The effect of possible leakage currents over the insulating surfaces from the diaphragm plate to the guard element and from the guard element to the planar base may be reduced by the factor of the open loop gain of the operational amplifier.

FIGS. 5A to 5F illustrate exemplary capacitive converter circuit configurations suitable for reducing the effect of possible leakage currents over the insulating surfaces between the diaphragm plate and the planar base in the sensor structure. The configurations include an operational amplifier 50, a terminal input 51 for the planar base electrode, a terminal input 56 for the diaphragm plate electrode, a terminal input 52 to the guard element electrode, a voltage source 54 or a current source 55, and a reference impedance 57. These components are connected to obtain a voltage output indicative of the capacitance between the diaphragm plate and the planar base without noticeable influence from changes in the surface conductivity of the insulating layer due to varying humidity. It is, however, clear to a person skilled in the art that further variations of the operational amplifier circuit configurations that apply operational amplification in the claimed manner may be applied without deviating from the scope of protection.

FIGS. 5A to 5D show exemplary inverting operational amplifier circuits where the positive non-inverting input is connected to a common ground or zero voltage terminal. Because of the nearly zero differential input voltage requirement of the closed loop feedback circuit, the voltage potential at the inverting input is nearly equal to that at the non-inverting input, and produces a virtual ground summing point 58.

Figure 5A:
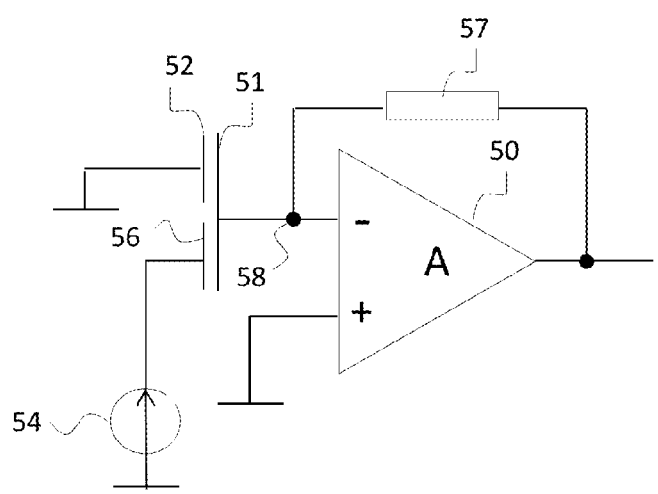
FIGS. 5A to 5F illustrate exemplary capacitive converter circuit configurations.

In FIG. 5A the guard element is arranged to the same potential as the planar base. As shown in FIG. 5A, the planar base terminal 51 connects to the virtual ground potential at the inverting input of the amplifier and the guard element terminal 52 is at ground potential. Due to this, the voltage and current between the guard element and the planar base are negligible and have practically no effect to the capacity values measured between the planar base and the diaphragm plate. The diaphragm plate terminal 56 is connected to the voltage source 54 so that the current between the guard element and the diaphragm plate is negligible and has practically no effect to the capacity values measured between the diaphragm plate and the planar base. The capacitance between the guard element and the planar base is connected between the ground and the virtual ground 58 and has practically no effect to the capacity values measured between the diaphragm plate and the planar base.

As a further background, let us denote the capacitance between the planar base terminal 51 and the diaphragm plate terminal 56 by $C_S$ and the capacitance between the planar base terminal 51 and the guard element terminal 52 by $C_L$. Let us also assume that the voltage source 54 is an AC voltage source with effective voltage Ui and that the feedback circuit element 57 is a capacitor with capacitance equal to $C_F$ and that the open loop gain of the amplifier is A. The output voltage $U_0$ of the amplifier can be written as $$U_O = \frac{C_S}{C_L/A + C_F} U_i \quad (1)$$

The effect of $C_L$ is thus reduced by the amount of the amplifier open loop gain. The capacitance between the diaphragm plate terminal 56 and the guard element terminal 52 also has no effect on the output voltage since it is connected in parallel with the voltage source Ui that as an ideal voltage source can supply the current to this capacitance without a change in the voltage.

Figure 5B:
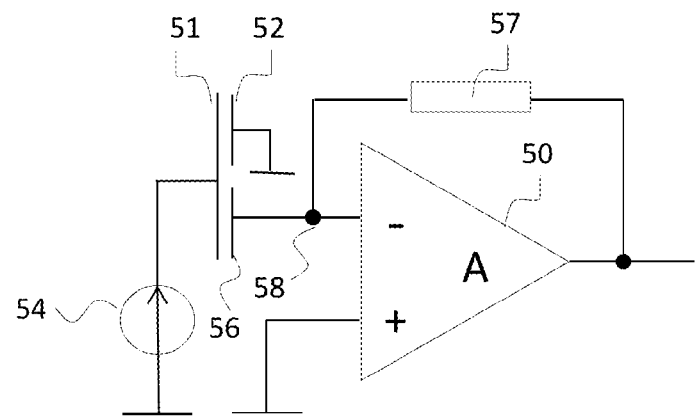

In FIG. 5B the guard element is arranged to nearly the same potential as the diaphragm plate. As shown in FIG. 5B, the diaphragm plate terminal 56 connects to the virtual ground potential at the inverting input of the amplifier and the guard element terminal 52 is at ground potential. Due to this, the voltage and current between the guard element and the diaphragm plate are negligible and have practically no effect to the capacity values measured between the planar base and the diaphragm plate. The planar base terminal 51 is connected to the voltage source 54 so that the current between the guard element and the planar base has practically no effect to the capacity values measured between the diaphragm plate and the planar base. The capacitance between the guard element and the planar base is connected between the ground and the voltage source, and has therefore practically no effect to the capacity values measured between the diaphragm plate and the planar base.

Figure 5C:
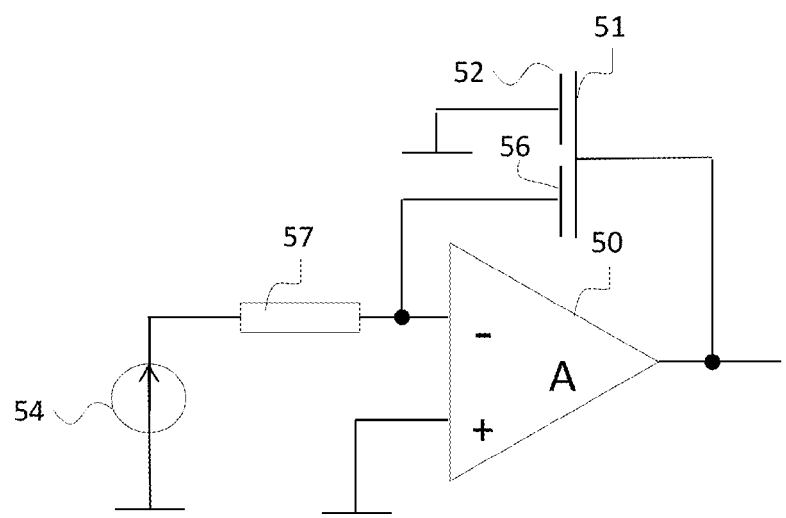

In FIG. 5C the guard element is also arranged to nearly the same potential as the diaphragm plate. As shown in FIG. 5C, the diaphragm plate terminal 56 connects to the virtual ground potential at the inverting input of the amplifier and the guard element terminal 52 is at ground potential. Due to this, the voltage and current between the guard element and the diaphragm plate are negligible and have practically no effect to the capacity values measured between the planar base and the diaphragm plate. The planar base terminal 51 is connected to the output of the amplifier 50 so that the current between the guard element and the planar base is negligible and has practically no effect to the capacity values measured between the diaphragm plate and the planar base. The capacitance between the guard element and the planar base is connected between the ground and the output of the amplifier 50, and has therefore practically no effect to the capacity values measured between the diaphragm plate and the planar base.

Figure 5D:
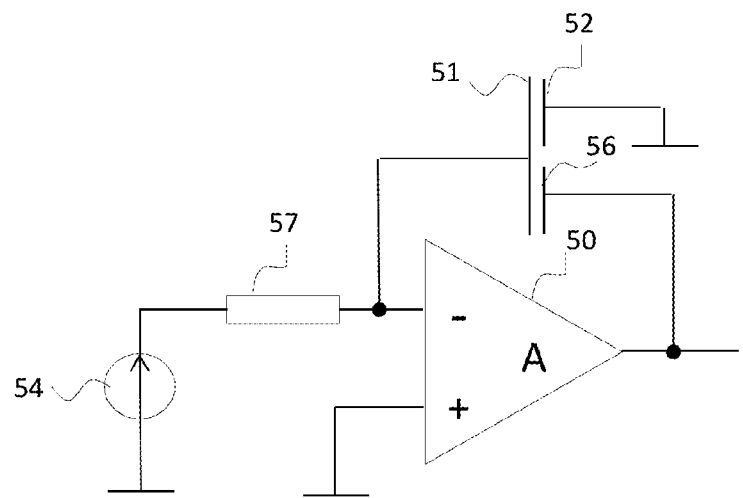

In FIG. 5D the guard element is again arranged to nearly the same potential as the planar base. As shown in FIG. 5D, the planar base terminal 51 connects to the virtual ground potential at the inverting input of the amplifier and the guard element terminal 52 is at ground potential. Due to this, the voltage and current between the guard element and the planar base are negligible and have practically no effect to the capacity values measured between the planar base and the diaphragm plate. The diaphragm plate terminal 56 is connected to the output of the amplifier 50 so that the current between the guard element and the diaphragm plate is negligible and has practically no effect to the capacity values measured between the diaphragm plate and the planar base. The capacitance between the guard element and the planar base is connected between the ground and the virtual ground 68 and has therefore practically no effect to the capacity values measured between the diaphragm plate and the planar base.

In FIGS. 5A to 5D the guard terminal is connected to the ground potential. Terminals of the planar base or the diaphragm plate provide the sensed capacitance, and one of the sensor terminals is connected to the virtual ground of the amplifier circuit. This enables to keep the guard terminal and one of the sensor terminals at nearly the same voltage while isolating the currents through the guard and the diaphragm plate terminals from each other. It is within the invention to use many variations of this principle other than those shown in FIGS. 5A to 5D.

Figure 5E:
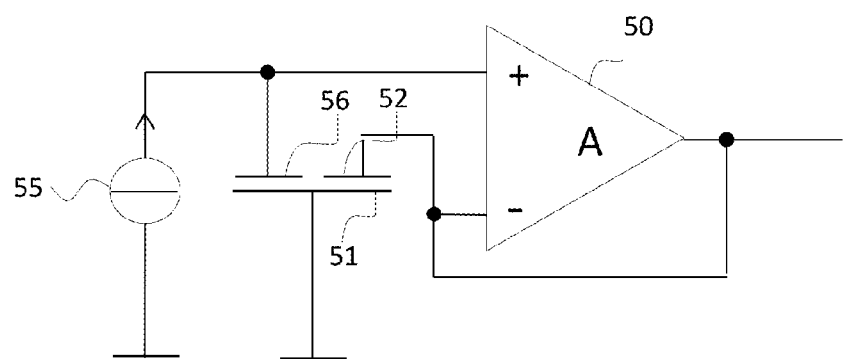
Figure 5F:
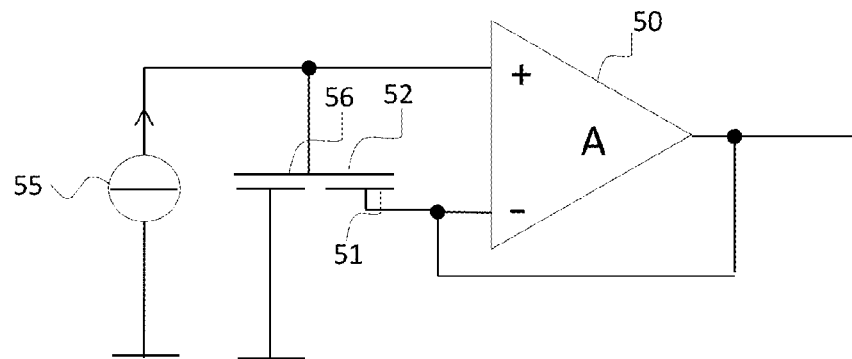

FIGS. 5E and 5F show exemplary non-inverting operational amplifier circuits. The operational amplifier 50 is used as a voltage follower where the output of the operational amplifier is connected directly back to the inverting input. The voltage potential at the inverting input is nearly equal to that at the non-inverting input.

In FIG. 5E the guard element is arranged to nearly the same potential as the diaphragm plate. As shown in FIG. 5E, the diaphragm plate terminal 56 is connected to a current source 55 with a predefined or otherwise known current. It is understood that the current source 55 may be also formed of a combination of current and voltage sources with internal impedances and where the current is not constant but it is known by being measured with e.g. a shunt resistor or other known current measurement technique. Since the diaphragm plate and the guard element are now in nearly the same potential, practically no current flows between them. Potential leakage or capacitive current between the guard element and the planar base has also practically no effect to the voltage or current between the diaphragm plate or the planar base since this current is provided by the amplifier without practically affecting the output voltage.

As a further background, let us denote the capacitance between the planar base terminal 51 and the diaphragm plate terminal 56 by $C_S$ and the capacitance between the inverting (−) and non-inverting (+) inputs of the amplifier by $C_i$. This capacitance includes both the input capacitance of the amplifier and the capacitance between the diaphragm plate terminal 56 and the guard element terminal 52. Let us also assume that the current source 55 is an AC source with effective current $J_i$ at frequency f and that the open loop gain of the amplifier is A. The output voltage $U_o$ of the amplifier can be written as $$U_O = \frac{1}{1 + \frac{C_i + C_S}{AC_S}} \frac{J_i}{2\pi f C_S} \quad (2)$$

The effect of $C_i$ is thus reduced by the amount of the amplifier open loop gain A. The capacitance between the planar base terminal 51 and the guard element terminal 52 also has no effect on the output voltage since it is connected between the output terminal of the amplifier and ground terminal and has thus almost no effect on the output voltage.

In FIG. 5F the guard element is arranged to nearly the same potential as the planar base. As shown in FIG. 5F, the planar base terminal 51 is connected to the current source 55 with the predefined or otherwise known current. Since the planar base and the guard element are now in nearly the same potential, practically no current flows between them. Potential leakage or capacitive current between the guard element and the diaphragm plate has practically no effect to the voltage or current between the diaphragm plate and the planar base since this current is provided by the amplifier without practically affecting the output voltage.

In FIGS. 5E and 5F the guard terminal is connected to the output of an amplifier, which is arranged to closely follow the potential of one of the sensor terminals thus keeping the current between the guard terminal and the one sensor terminal negligible. It is within the invention to use variations of this principle other than given in FIGS. 5E and 5F.

All the examples of FIGS. 5A through 5F use an amplifier in a feed-back configuration to keep the potential of the guard terminal close to the potential of one of the sensor terminals while at the same time keeping the current paths through the guard and the diaphragm plate terminals separated.

Figure 6:
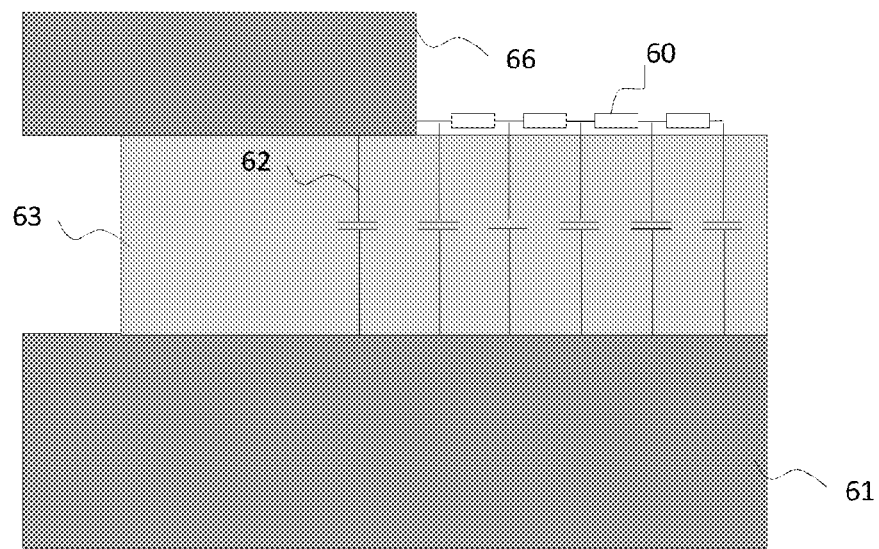
FIG. 6 illustrates spreading capacitance effect with a RC-transmission line.

The configurations of FIGS. 3 and 4 illustrated sensor structures suitable for reducing resistive and capacitive leakage along the surfaces of the insulating side wall layer. In addition to that, also other stray effects may occur in capacitive pressure sensors. One effect could be called as a spreading capacitance effect or a transmission line effect. This effect is caused by a finite surface resistivity of the side wall layer and the capacitance over the side wall layer. FIG. 6 illustrates this spreading capacitance effect with a RC-transmission line 60. FIG. 6 is a side view that shows the sensor structure from its width direction, and shows the planar base 61, the side wall layer 63 and the diaphragm plate 66 elements described in more detail above with FIG. 1. According to the transmission line theory, an equivalent parallel capacitance $C_p$ and resistance $R_p$ seen from the end of an infinite RC-transmission line is:

$$C_p = \sqrt{\frac{r}{\pi f c}},$$

$$R_p = \sqrt{\frac{c}{4\pi f r}}$$

(3)

where r is the surface resistance per unit length, c is the insulator capacitance per unit length and f is the measurement frequency. This equivalent capacitance and resistance is coupled in parallel with the insulator capacitance 62 and with the sensor capacitance between the diaphragm and the planar base.

In practice, it is necessary to keep the humidity related capacitance change small enough, typically <1 fF. In order to achieve this, an extremely high surface resistivity is required. Let us assume an exemplary configuration where the surface resistance of the side wall layer is $10^{15}$ ohms square, the circumference of the diaphragm plate 66 is 5 mm, the thickness of the side wall layer is 1 µm, the dielectric coefficient of the side wall material is 3.9 and the measurement frequency is 100 kHz. With these values, the equation (3) gives a parallel capacitance 0.83 fF and a parallel resistance 1.9 Gohm. This is the level where the capacitance change should remain. If the surface resistance drops to $10^{12}$ ohms square the capacitance will rise to 25 fF, which is already too much by a factor of 25. The added parallel capacitance corresponds in the latter example to only 0.14 µm effective addition to the width of the diaphragm plate 66.

Figure 7:
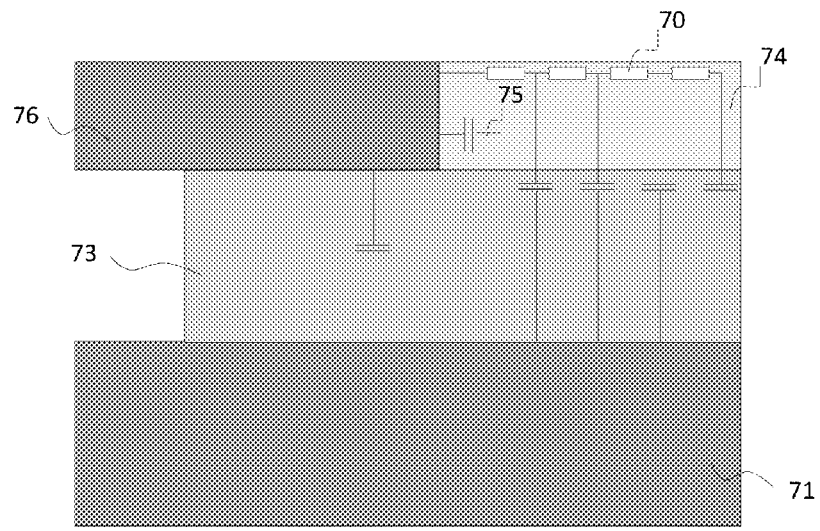
FIG. 7 illustrates an embodiment where the isolation area is covered by a layer of insulating material.

FIG. 7 illustrates an embodiment where the transmission line effect is reduced by covering the isolation area by a layer of insulating material. Insulating material refers here to any material that does not conduct electric currents under the influence of electric fields, including dielectric materials. FIG. 7 is a side view that shows the sensor structure from its width direction, and shows the planar base 71, the side wall layer 73 and the diaphragm plate 76 elements described in more detail above with FIG. 1. In the exemplary sensor structure, the isolation area is completely covered with insulating material 74 that passivates the top surface of the side wall layer 73. Also a partial cover where the layer of insulating material extends, for example, from the outer surface of the side wall layer to the diaphragm plate may be applied within the scope of protection.

In comparison to FIG. 3, the RC-transmission line 70 is now transferred to the surface of the layer of the insulating material. The increased thickness of the combination of the side wall layer 73 and the layer 74 of insulating material reduces the capacitance over unit length, and thereby alleviates the transmission line effect. For example, if the layer 74 of insulating material is eight times thicker than the height of the side walls and has the same dielectric coefficient, the parallel capacitance could be reduced by a factor of three. Even if moisture would diffuse through the insulating material, the surface resistance at the interface between the diaphragm plate 76 and the insulating material 74 would remain high in the absence of free surface.

Figure 8:
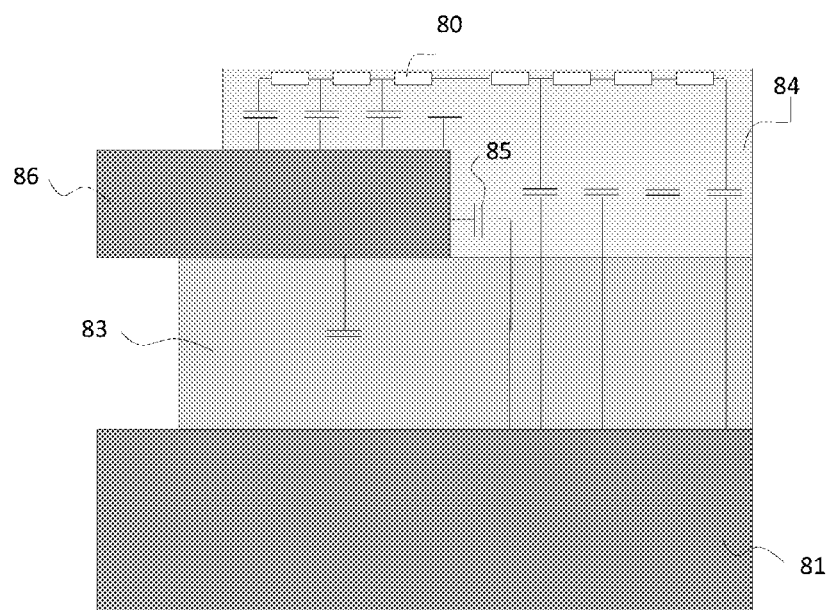
FIG. 8 illustrates an embodiment, where the layer of insulating material covers the isolation area and at least part of a first planar material layer of the diaphragm plate.

This reduction is remarkable, but may still not be enough for all applications. In the embodiment of FIG. 7, the layer of insulating material and the first planar material layer of the diaphragm plate are of equal thickness. FIG. 8 illustrates a further embodiment, where the layer of insulating material extends from the outer surface of the side wall layer 83 to a distance towards the gap on the top surface of the side wall layer, and covers the isolation area and at least part of the diaphragm plate. FIG. 8 is a side view that shows the sensor structure from its width direction, and shows the planar base 81, the side wall layer 83 and the diaphragm plate 86 elements described in more detail above with FIG. 1.

In the configuration of FIG. 8, the RC-transmission line 80 is further displaced from the planar base 81. In the structure of FIG. 8, the capacitive coupling formed from the first material layer of the diaphragm plate is more complex, which again reduces the spreading effect. In order to avoid influencing the pressure response of the diaphragm or causing bending moments due to thermal expansion mismatch, the layer of the insulating material may not, however, extend to the area of the diaphragm. The edge of the layer 84 of insulating material is advantageously further away from the periphery of the diaphragm than the thickness of the diaphragm.

Referring back to FIG. 7, in addition to the spreading capacitance caused by the transmission line effect, a parallel capacitance 75 is formed through the insulating material 74 between the planar base 71 and the diaphragm plate 76. If the insulating material is, for example, a polymer the dielectric coefficient may change due to moisture absorption and thus change the capacitance 75. The parallel capacitance 85, 95 is shown also in structures of FIGS. 8 and 9.

Figure 9:
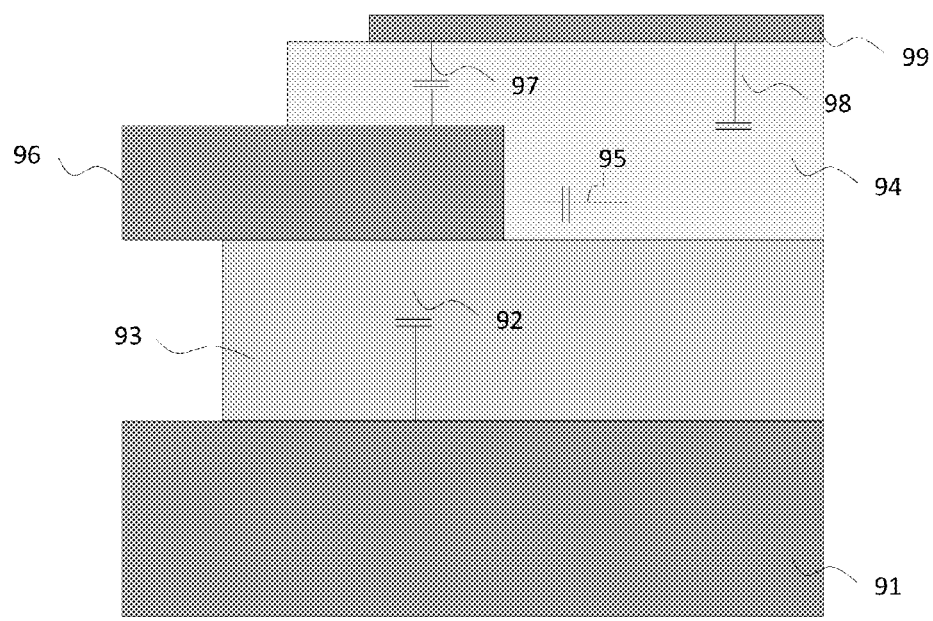
FIG. 9 illustrates an embodiment, where a layer of conducting material extends on the top surface of the side wall layer from the outer surface of the side wall layer to a distance towards the gap over the layer of insulating material.

FIG. 9 illustrates a further embodiment, where a layer of conducting material 99 extends on the top surface of the side wall layer from the outer surfaces of the side wall layer to a distance towards the gap over the layer of insulating material. FIG. 9 is a side view that shows the sensor structure from its width direction, and shows the planar base 91, the side wall layer 93 and the diaphragm plate 96 elements described in more detail above with FIG. 1. FIG. 9 shows also the layer of insulating material 94 discussed in more detail in FIG. 8. In the embodiment of FIG. 9, the layer of insulating material 94 also extends from the outer surface of the side wall layer 93 to a distance towards the gap on the top surface of the side wall layer, and covers the isolation area and at least part of the diaphragm plate 96.

In the configuration of FIG. 9, the conducting layer 99 may be connected to a capacitive converter circuit to reduce the RC-transmission line effect, in a manner earlier discussed with the guard element in FIG. 4 and FIGS. 5A to 5F. By means of the operational amplifier circuit, a capacitance 97 from the diaphragm plate 96 to the shield layer 99 of conductive material and a capacitance 98 from the layer 99 of conductive material to the planar base 91 can be made to have no effect to the capacitance values measured between the diaphragm plate and the planar base. Capacitance 95 through the layer of the insulating material 94 will remain connected in parallel with the insulator capacitance 92 and the true sensor capacitance between the diaphragm plate and the planar base.

The embodiments are not mutually exclusive but can be combined in various ways. For example, the sensor structure of FIG. 9 may include a guard element and a layer of conductive material, and the elements may be connected to each other and used with any of the operational amplifier circuits as defined above.

Figure 10:
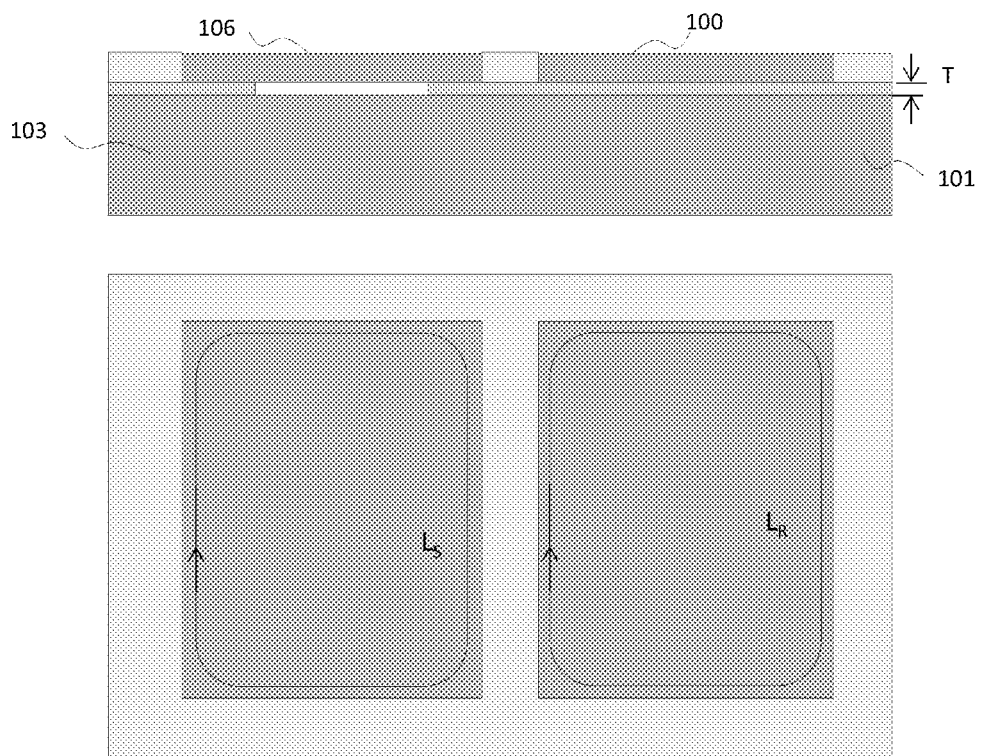
FIG. 10 illustrates an embodiment of a microelectromechanical pressure sensor structure provided with a reference plate.

In view of FIGS. 6 to 9, it is understood that the effective parallel capacitance and resistance (Cp and Rp of equation (3)) of the RC-transmission line 60, 70, 80, and the parallel capacitance 75, 85, 95 are proportional to the length of the perimeter of the diaphragm plate 63, 73, 83, 93. FIG. 10 illustrates a side view from width direction and a top view of a sensor structure. FIG. 10 shows the planar base 101, the side wall layer 103 and the diaphragm plate 106 elements described in more detail above with FIG. 1. The sensor structure of FIG. 10 is provided with a reference plate 100 that has the same thickness as the diaphragm plate, has the same electrical properties as the diaphragm plate and extends on the isolation area on the top surface of the side wall layer 103. The reference plate is advantageously, but not necessarily of the same material as the diaphragm plate. Due to the same thickness and the same conditions in the edges of the elements, similar transmission line and parallel capacitance effects appear in the perimeters of the diaphragm plate 106 and the reference plate 100.

The capacitance $C_S$ measured between the diaphragm plate and the planar base comprises a sum of three terms: a diaphragm capacitance, a support area capacitance and an edge capacitance. The diaphragm capacitance refers to the capacitance over the diaphragm area $A_d$ within the periphery of the diaphragm. The support area capacitance refers to the capacitance over the part $A_s$ of the top surface of the side wall layer that is covered by the diaphragm plate. The edge capacitance refers here to a combination of the transmission line capacitance and the stray parallel capacitance discussed earlier. Since both of these components are dependent on the length of the perimeter of the plate, the equation for Cs may be written as:

$$C_S = \varepsilon_0 \frac{A_d}{T} + \varepsilon_r \varepsilon_0 \frac{A_s}{T} + L_S c_E \quad (4)$$

where $A_d$ is the diaphragm area, $A_s$ is the support area of the diaphragm plate on the top surface of the side wall layer, T is the height of the side walls (the thickness of the side wall layer), $L_s$ is the length of the periphery of the diaphragm plate, $\varepsilon_r$ is the relative dielectric constant of the side wall layer material, $\varepsilon_0$ is the dielectric constant, $c_E$ is an edge capacitance per unit length caused by the transmission line over the outer periphery of the side walls and by the stray capacitance within the thickness of the side wall layer.

Correspondingly, the capacitance $C_R$ measured for the reference plate can be written as:

$$C_R = \varepsilon_r \varepsilon_0 \frac{A_R}{T} + L_R c_E \quad (5)$$

where $A_R$ is the area of the reference plate 100 and $L_R$ is the length of the periphery of the reference plate 100.

When the pressure sensor structure comprises electrical leads to the planar base 101, to the diaphragm plate 106, and to the reference plate 100, they can be connected to an electrical circuit that forms an output quantity, referred herein as a compensated sensor capacitance $C_{comp}$. The compensated sensor capacitance $C_{comp}$ can be written as:

$$C_{Scomp} = C_S - KC_R = \varepsilon_0 \frac{A_d}{T} + \frac{\varepsilon_r \varepsilon_0}{T}(A_S - KA_R) + (L_S - KL_R)c_E \quad (6)$$

where K is a weight coefficient for the reference plate capacitance. The last term of equation (6) includes the contribution of the transmission line over the outer edge of the side wall layer and the stray capacitance within the thickness of the side wall layer. This contribution may be eliminated by adjusting the weight coefficient K to be equal to the ratio of the length of the periphery of the diaphragm plate $L_s$ and the length of the periphery of the reference plate $L_R$.

$L_s - KL_R = 0 => K = L_s/L_R$

The sensor structure of FIG. 10 shows an embodiment where the reference plate and the diaphragm plate are equal in size. The circumferential lengths of the plates are equal, i.e. $L_s = L_R$ whereby K=1.

In another aspect, from equation (6) it can be seen that the support area $A_s$ of the diaphragm plate 116 introduces an additional capacitance over the side wall layer. The magnitude of this additional capacitance can be in the order of the diaphragm area capacitance, so it easily degrades the resolution, linearity and thermal stability of the pressure sensor. The effect of the support area capacitance can, however, be eliminated by adjusting the sizes of the support area $A_S$ and the area of the reference plate $A_R$ also in relation to each other such that the second term of equation (6) becomes zero.

$A_s - KA_R = 0 => K = A_s/A_R$

If the weight coefficient K is set to be equal to the ratio of the support area $A_S$ and the area of the reference plate $A_R$, the stray effects can be structurally compensated, and the compensated sensor capacitance $C_{comp}$ corresponds very accurately to the true variations in the diaphragm deflection. The significant improvement in efficiency can be achieved with a very compact sensor structure, especially compact in the thickness dimension.

Figure 11A:
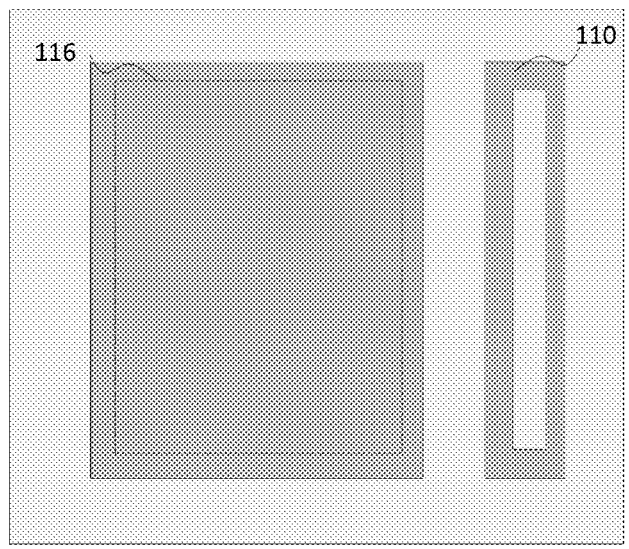
FIGS. 11A to 11D show different diaphragm plate and the reference plate configurations.

In the embodiment of FIG. 10 the circumferential lengths $L_s$, $L_R$ of the plates are equal, but the reference plate area $A_R$ is much larger than the support area $A_s$ of the diaphragm plate. With this type of configuration, it is possible to select K so that the last term of the equation becomes zero. FIG. 11A shows a top view of a pressure sensor structure that illustrates an embodiment where the form of the reference plate on the isolation area deviates from the form of the diaphragm plate. This way one can adjust the ratio of both the areas and the circumferences of the plates, and adjust both the second and the third terms of the equation (6) to zero.

Figure 11B:
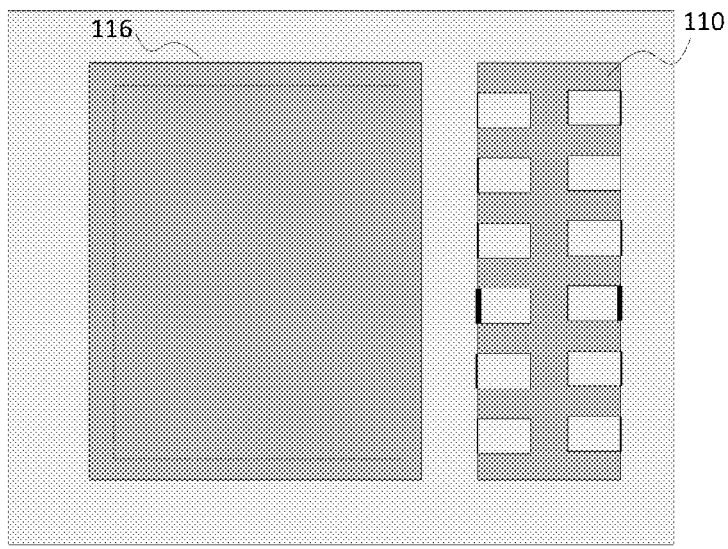
Figure 11C:
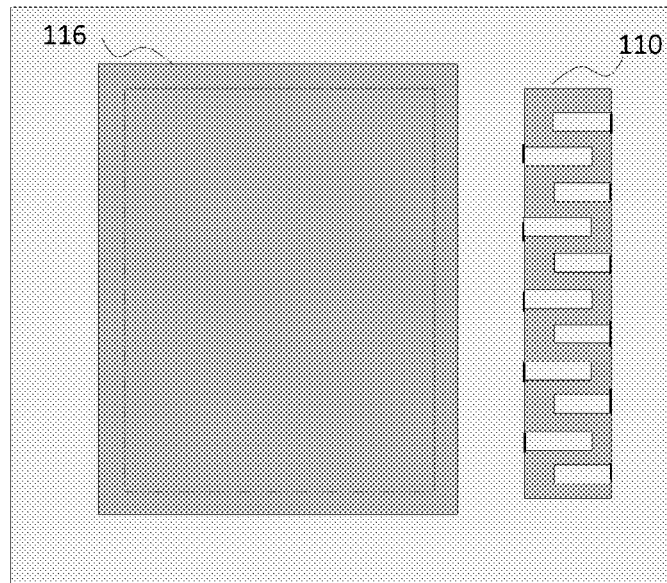

FIGS. 11A to 11C show a top view of the sensor structure, with the diaphragm plate 116 and the reference plate 110 positioned on the top surface of the side wall layer. In FIG. 11A, the reference plate has a circumferential form, more specifically a recessed rectangular or a closed loop positioned besides the diaphragm plate. In FIGS. 11B and 11C, the reference plate has a winding perimeter. In FIG. 11B, the perimeter of the reference plate is in form of a comb, and in FIG. 11C, the reference plate has a meandering form.

In all configurations of FIG. 11A to 11C, the perimeter length of the reference plate $L_R$ remains the same as the perimeter length in FIG. 10, but the area $A_R$ of the reference plate is smaller than the area of the reference plate in FIG. 10. It is clear to a person skilled in the art that the scope of protection is not limited to the exemplary diaphragm plate and reference plate configurations of FIGS. 11A to 11D. The desired ratios can be achieved with a plurality of different shapes of the diaphragm plate and the reference plate.

Figure 11D:
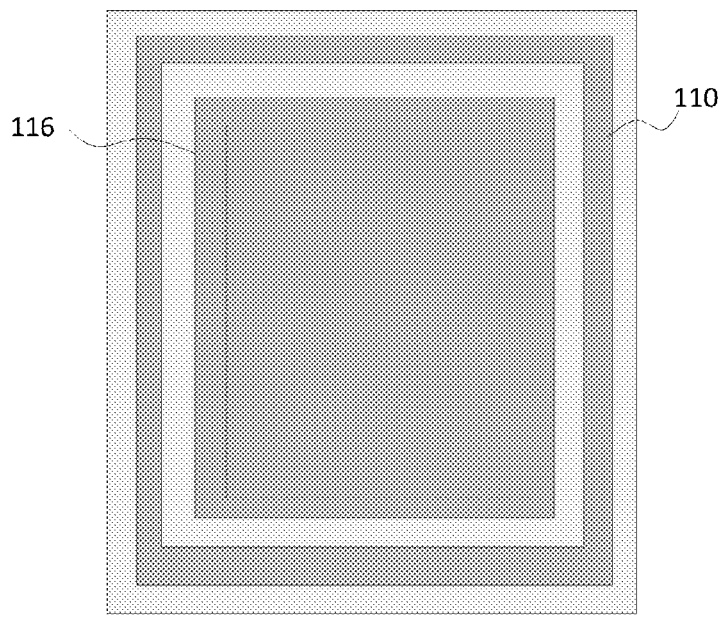

It is typically preferable for e.g. mechanical stability to have a symmetrical sensor structure where the diaphragm is located symmetrically in the middle of the planar base. In an aspect, the reference plate 110 of FIGS. 11A to 11C could be replicated on two or four sides of the sensor to achieve the required symmetry. FIG. 11D illustrates another alternative, where the reference plate has been arranged to surround the diaphragm plate 116. It is understood that in these cases the reference plate perimeter $L_R$ gets to be longer than the diaphragm plate perimeter $L_S$ and thus K becomes less than one. In FIG. 11D the reference electrode surrounds the sensor plate as an annular ring. In this case the value of K is less than 0.5 since both the inner and outer perimeters of the reference plate 110 are longer than the perimeter of the diaphragm plate 116.

Figure 12:
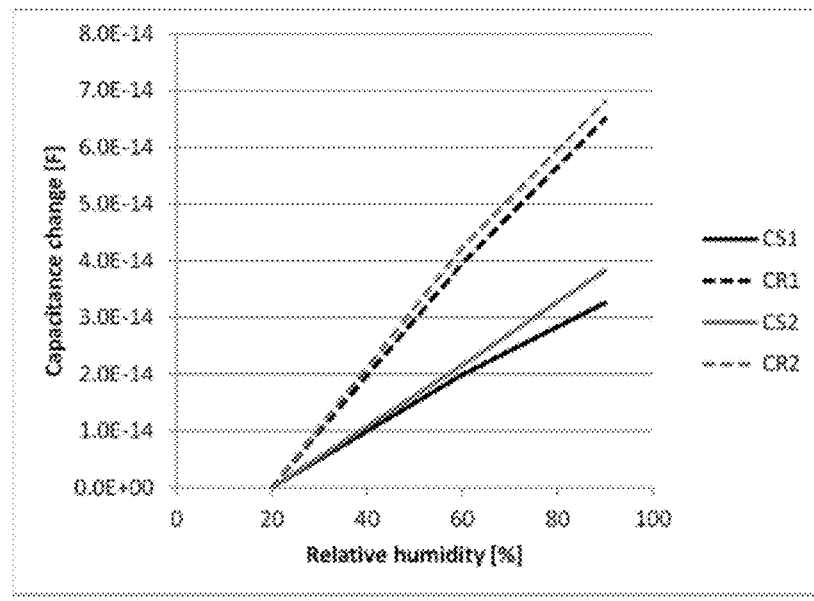
FIG. 12 illustrates results from an exemplary humidity test.

FIG. 12 illustrates effect of humidity with results from an exemplary humidity test. A test was made with two test samples, where the ratio of the length of the periphery of the diaphragm plate $L_s$ and the length of the periphery of the reference plate $L_S/L_R$ was adjusted to 0.5. Measured values for the diaphragm capacitance for the two test samples are denoted in FIG. 12 with CS1 and CS2. Measured values for the reference plate capacitance for the two test samples are denoted with CR1 and CR2, respectively. The material of the side wall layer in this experiment was polyimide. The water absorption of this material is 1% at 100% relative humidity, which changes the dielectric coefficient of the material by 30%. The initial capacitance value was measured at 20% relative humidity, and further capacitance values were measured at 60% and 90% relative humidity. The values measured at 60% and 90% relative humidity are shown as a capacitance change in relation to the initial capacitance value at 20% relative humidity. It can be seen that the capacitances of the diaphragm plate may change by 30 to 40 fF and the capacitances of the reference plate may change by 65 to 70 fF because of humidity.

Figure 13:
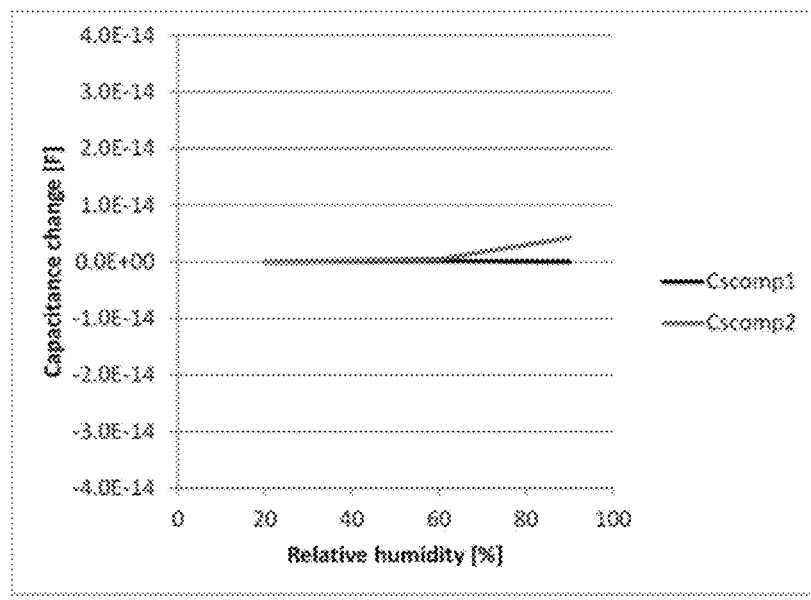
FIG. 13 shows a compensated capacitance in the same test sample configurations.

FIG. 13 shows a capacitance compensated in the manner described above with equation (6) in the same test sample configurations. A weight coefficient K=0.5 was used. It is seen that with compensation, the maximum humidity induced capacitance change is 4 fF, and the change is less than 0.5 fF for other points. These results confirm that compensation by the weighted difference of sensor and reference capacitances may reduce the error by at least by a factor of 9, but may compensate even by a factor of 50, depending on the ambient humidity.

In the above embodiments of FIGS. 10 and 11 it was assumed that the conditions along the perimeters of the diaphragm plate 106, 116 and the reference plate 100, 110 are practically similar. This assumption can be made if the isolating distance from the diaphragm plate to the reference plate, from the diaphragm plate to the top edge of the outer surface of the side wall layer and from the reference plate to the top edge of the outer surface of the side wall layer is large enough, at least larger than the thickness of the plates.

But even if the distance is smaller and may even be different at different locations rendering the edge capacitance per unit length $c_e$ variable according to location, an optimum value of the ratio K can always be found so that the effect of the edge capacitance in the weighted difference of the two measured capacitances $C_S$ and $C_R$ is zero. Instead of zeroing the last term of equation (6) one may obtain an optimum K by zeroing the weighted difference of two integrals:

$$\oint_{L_S} C_e(x, y) dL - K \oint_{L_R} C_e(x, y) dL \qquad (7)$$

where the integrals are calculated along the perimeters of the diaphragm plate and the reference plate, respectively, and $c_e(x,y)$ is the variable edge capacitance per unit length as a function of location on the surface.

Figure 14:
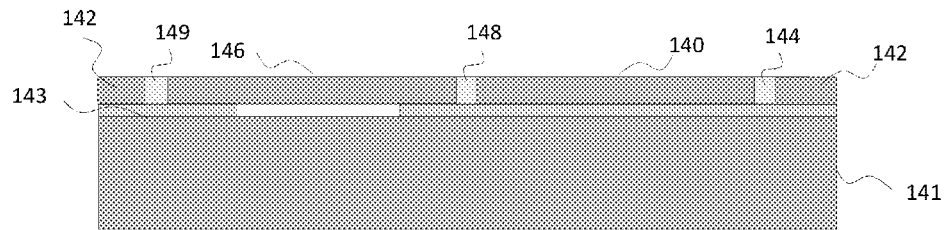
FIG. 14 illustrates a further embodiment for decreasing stray capacitances in the sensor structure.

FIG. 14 illustrates a further embodiment for decreasing stray capacitances in the sensor structure. FIG. 14 is a side view that shows the sensor structure from its width direction, and shows the planar base 141, the side wall layer 143 and the diaphragm plate 146 elements described in more detail above with FIG. 1. FIG. 14 shows also a reference plate 140 that, in this example, is positioned side by side with the diaphragm plate 146 on the top surface of the side wall layer. Other configurations of the reference plate positioning, like the one of FIG. 11D where the reference plate circumscribes the diaphragm plate, are feasible, as well. The reference plate 140 and the diaphragm plate 146 are separated from each other by a first trench 148 that is formed by a region of the isolation area between the diaphragm plate 146 and the reference plate 140. A second trench 144, 149 is formed by a part of the isolation area that circumscribes the diaphragm plate 146, the reference plate 140 and the first trench 148.

In FIG. 14, a portion 144 of the second trench is adjacent to the reference plate 140 and a portion 149 of the second trench is adjacent to the diaphragm plate 146. It is noted that in the alternative configuration 11D the second trench comprises only the portion adjacent to the reference plate 110. A guard element 142 extends on the top surface of the side wall layer from the periphery of the second trench 144, 149 towards the top edge of the outer surfaces of the side wall layer 143. In FIG. 14, the portion 149 of the second trench adjacent to the diaphragm plate is thus between the diaphragm plate 146 and the guard element 142. Correspondingly, the portion 144 of the second trench adjacent to the reference plate is between the reference plate 140 and the guard element 142. It is understood that with alternative guard element configurations, the configurations of the first and second trenches vary accordingly.

The first trench 143 or the second trench 144, 149, or both the first trench 148 and the second trench 144, 149 may be similarly empty or covered with insulating material. Advantageously the trenches 144, 148, 149 have equal width and are similarly empty or similarly covered with insulating material.

This configuration including the diaphragm plate, the reference plate 140 and the first and second trenches 148, 144, 149 ensures that electrical conditions along the perimeters of the diaphragm plate 146 and the reference plate 140 are as similar as possible at all locations. By means of this it is easy to use the above equations to determine the optimum value for the ratio K to provide a constant edge capacitance per unit length so that the edge capacitance changes equally as a function of humidity at all locations.

Figure 15:
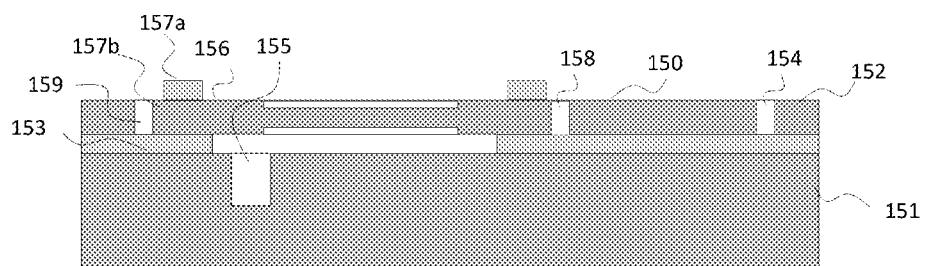
FIG. 15 illustrates a further embodiment of a microelectromechanical pressure sensor structure.

FIG. 15 illustrates a further embodiment of a microelectromechanical pressure sensor structure. FIG. 15 is a side view that shows the sensor structure from its width direction, and shows the planar base 151, the side wall layer 153 and the diaphragm plate 156 elements described in more detail above with FIG. 1. Contrary to the prior art structure of FIG. 1, the sensor structure may be oblong such that the diaphragm is narrow to experience a minimized difference between bending of the planar base and of the diaphragm along the width of the diaphragm. The diaphragm has a length and a width in the direction of the plane of the planar base, wherein the length is in a direction of the longest extent of the diaphragm, and the width is in a direction perpendicular the direction of the length in the plane of the diaphragm plate. In an oblong pressure sensor, the length of the diaphragm is at least three times the width of the diaphragm, due to which it very accurately aligns with the bending form of the wafer. As a result of this, a total error caused by bending of the pressure sensor structure is significantly reduced and a more robust structure is achieved. At the same time, the longer diaphragm provides more deflected area for detection and thus significantly improves sensitivity of the device.

In an oblong sensor structure of FIG. 15, the gap may include one or more cavities 155 that extend in the gap away from the plane of the planar base 151. Such cavities increase the gap volume, and thereby stability of the sensor, without causing essential negative side effects to the measurements.

The sensor structure may also include one or more recesses that are arranged to the diaphragm plate that provides the diaphragm and anchoring structures around its periphery. The recess or recesses act locally on the diaphragm and efficiently compensate for various effects that cause differences between bending structures of the layered elements. In FIG. 15 the diaphragm plate is a two-layer structure that comprises a first material layer 157a and a second material layer 157b. The outer surface of the diaphragm plate is formed by surface parts of the first material layer 157a and surface parts of the second material layer 157b. Surface parts of the first material layer 157a form a planar surface part that includes a periphery of a first recess. When the first material layer 157a is of the same material as the side wall layer 153, the first recess effectively eliminates effects of different bending shapes of the element layers. Surface parts of the second material layer 157b form a planar surface part that includes a periphery of a second recess. A third recess may be provided on the other side of the diaphragm plate 156. The second recess, or the second and the third recess together can be used to further alleviate the effects of different bending shapes of the element layers.

The sensor structure of FIG. 15 may include also a reference plate 150, the guard element 152 and the first and second trenches 158, 154, 159 discussed in more detail with FIG. 14. A combined contribution of these features provides a robust and at the same time increasingly accurate microelectromechanical pressure sensor structure.

Figure 16:
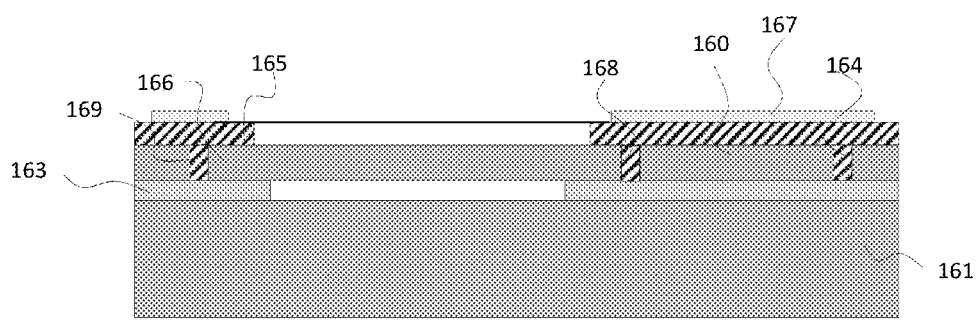
FIG. 16 illustrates aspects of a further embodiment where the isolation areas form trenches between the elements on the top surface of the side wall layer.

FIG. 8 illustrated an embodiment, where the layer of insulating material extends from the outer surface of the side wall layer to a distance towards the gap on the top surface of the side wall layer, and covers the isolation area and at least part of the diaphragm plate. FIG. 9 illustrated an embodiment, where a layer of conducting material further extends over the layer of insulating material. FIG. 16 illustrates aspects of a further embodiment that combines these features into a structure where the isolation areas form trenches between the elements on the top surface of the side wall layer. FIG. 16 is a side view that shows the sensor structure from its width direction, and shows the planar base 161, the side wall layer 163 and the diaphragm plate 166 elements described in more detail above with FIG. 1. FIG. 16 also shows the reference plate 160, the guard element 162 and the first and second trenches 168, 164, 169 discussed in more detail with FIG. 14. The insulating material fills the first and second trenches 168, 164, 169 and extends as a layer 165 from the outer surfaces of the side wall layer 163 covering the reference plate 160 and partly the diaphragm plate 166. In order to facilitate the compensation with the weighted difference, as discussed above, the layer of conducting material 167 extends over the layer of insulating material 165 and covers the first trench 168 and the second trench 164, 169.

Figure 17:
FIG. 17 illustrates an embodiment of a microelectromechanical pressure sensor.

FIG. 17 illustrates an embodiment of a microelectromechanical pressure sensor 170. The pressure sensor comprises a sensor structure 171 which may be any of the alternative sensor structures described above. The pressure sensor also comprises an electrical circuit part 172. The sensor structure 171 and the electrical circuit part 172 may be separate dies molded in plastic material 173. A polymer dielectric layer 174 may be deposited in the re-built wafer. Contacts to the electrical terminals 175 of the dies may be provided with deposited film layers through openings on the dielectric layer 174. The electrical circuit may be connected to electrical leads to the planar base, to the guard layer and to the diaphragm plate. The electrical circuit may also comprise an operational amplifier in a feed-back configuration connected to keep a guard element in a same potential with either of the planar base or the first planar layer, and keep the current paths through these terminals separated, as discussed with FIG. 4 and FIGS. 5A to 5F. The electrical circuit may also be connected to electrical leads to the planar base, to the layer of conducting material and to the diaphragm plate. The electrical circuit may comprise an operational amplifier in a feed-back configuration, connected to keep the layer of conducting material in a same potential with either of the planar base or the first planar layer, and keep the current paths through the guard and the diaphragm plate terminals separated, as discussed with FIG. 4 and FIGS. 5A to 5F.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A microelectromechanical pressure sensor structure that comprises a planar base and a side wall layer and a diaphragm plate, wherein
    the side wall layer forms side walls that extend as a circumference away from the planar base to a top surface of the side wall layer;
    the planar base, the side wall layer and the diaphragm plate are attached to each other to form a hermetically closed gap in a reference pressure;
    the top surface of the side wall layer comprises at least one isolation area that is not covered by the diaphragm plate.

2. A microelectromechanical pressure sensor structure of claim 1, wherein the isolation area extends from the outer surface of the side wall layer to a non-zero distance towards the gap on the top surface of the side wall layer.

3. A microelectromechanical pressure sensor structure of claim 1, wherein the isolation area is at least partly covered with insulating material.

4. A microelectromechanical pressure sensor structure of claim 3, wherein the insulating material extends as a layer on the top surface of the side wall layer from the outer surface of the side wall layer to the diaphragm plate.

5. A microelectromechanical pressure sensor structure of claim 4, wherein the layer of insulating material and the diaphragm plate are of equal thickness.

6. A microelectromechanical pressure sensor structure of claim 4, wherein the layer of insulating material covers the isolation area and at least part of a first planar material layer of the diaphragm plate.

7. A microelectromechanical pressure sensor structure of claim 6, further comprising a layer of conducting material that extends over the layer of insulating material from the outer surface of the side wall layer to a distance towards the gap.

8. A microelectromechanical pressure sensor structure of claim 1, wherein
the isolation area extends on the top surface of the side wall layer from a periphery of the diaphragm plate to a non-zero distance towards the outer surface of the side wall layer;
a guard element extends on the top surface of the side wall layer from the periphery of the isolation area towards the outer surface of the side wall layer.

9. A microelectromechanical pressure sensor structure of claim 8, wherein the guard element extends on the top surface of the side wall layer from the periphery of the isolation area to the outer surface of the side wall layer.

10. A microelectromechanical pressure sensor structure of claim 1, wherein the sensor structure comprises a reference plate that that has the same thickness as the diaphragm plate and extends on the isolation area on the top surface of the side wall layer separated from the diaphragm plate.

11. A microelectromechanical pressure sensor structure of claim 10, wherein
a top edge of the inner surfaces of the side walls forms a periphery of a diaphragm;
the diaphragm plate spans over the periphery of the diaphragm;
the pressure sensor structure comprises electrical leads to the planar base, to the diaphragm plate, and to the reference plate.

12. A microelectromechanical pressure sensor structure of claim 10, wherein the reference plate has the same form on the top surface of the side wall layer as the diaphragm plate.

13. A microelectromechanical pressure sensor structure of claim 10, wherein the reference plate has a circumferential form on the top surface of the side wall layer.

14. A microelectromechanical pressure sensor structure of claim 13, wherein the reference plate circumscribes the diaphragm plate on the top surface of the side wall layer.

15. A microelectromechanical pressure sensor structure of claim 10, wherein the reference plate has a winding perimeter on the top surface of the side wall layer.

16. A microelectromechanical pressure sensor structure of claim 15, wherein the reference plate has a comb-formed or meandering perimeter on the top surface of the side wall layer.

17. A microelectromechanical pressure sensor structure of claim 10, wherein the ratio of the length of the periphery of the diaphragm plate and the length of the periphery of the reference plate is adjusted to be equal to a weight coefficient of a reference plate capacitance in a compensated sensor capacitance.

18. A microelectromechanical pressure sensor structure of claim 17, wherein
an area through which the side wall layer and the diaphragm plate are attached to each other forms a diaphragm support area;
the ratio of the diaphragm support area to the area of the reference plate is equal to the weight coefficient of the reference plate capacitance in the compensated sensor capacitance.

19. A microelectromechanical pressure sensor structure of claim 10, wherein a weight coefficient of a reference plate capacitance in a compensated sensor capacitance equals to a value obtained by zeroing the weighted difference of two integrals $$\oint_{L_S} C_e(x,y)dL = K \oint_{L_R} C_e(x,y)dL$$

where the first integral is calculated along the perimeter of the diaphragm plate and the second integral is calculated along the perimeter of the reference plate and $C_e(x,y)$ is a variable edge capacitance per unit length as a function of location on the surface.

20. A microelectromechanical pressure sensor structure of claim 10, wherein the diaphragm plate and the reference plate are separated by a first trench that is formed by a region of isolation area between the diaphragm plate and the reference plate.

21. A microelectromechanical pressure sensor structure of claim 20, wherein
a second trench is formed by a part of the isolation area that circumscribes the diaphragm plate, the reference plate and the first trench;
a guard element extends on the top surface of the side wall layer from the periphery of the second trench towards the outer surface of the side wall layer.

22. A microelectromechanical pressure sensor structure of claim 21, wherein the guard element is a guard ring that circumscribes the diaphragm plate, the reference plate and the first trench.

23. A microelectromechanical pressure sensor structure of claim 21, wherein the first trench or the second trench, or both the first trench and the second trench are covered with insulating material.

24. A microelectromechanical pressure sensor structure of claim 23, wherein the first trench and the second trench are of equal width and are both covered or not covered with the insulating material.

25. A pressure sensor that comprises a pressure sensor structure of claim 1 and an electrical circuit connected to the pressure sensor structure.

26. A pressure sensor of claim 25, wherein
the electrical circuit is connected to electrical leads to the planar base, to the guard element and to the diaphragm plate;
the electrical circuit comprises an operational amplifier in a feed-back configuration connected to keep the guard element in a same potential with either of the planar base or the diaphragm plate, and to separate a current path through the guard element and the diaphragm plate from each other.

27. A pressure sensor of claim 26, wherein the operational amplifier is an inverting operational amplifier, or a non-inverting operational amplifier.

28. A pressure sensor of claim 25, wherein
the electrical circuit is connected to electrical leads to the planar base, to the layer of conducting material and to the diaphragm plate;
the electrical circuit comprises an operational amplifier in a feed-back configuration connected to keep a layer of conducting material in a same potential with either of the planar base or the diaphragm plate, and to separate a current path through the layer of conducting material and a current path through diaphragm plate from each other.

29. A pressure sensor of claim 28, wherein the operational amplifier is an inverting operational amplifier, or a non-inverting operational amplifier.

* * * * *